(12) United States Patent
Wang et al.

(10) Patent No.: US 11,755,094 B2
(45) Date of Patent: *Sep. 12, 2023

(54) WIDE RANGE POWER MECHANISM FOR OVER-SPEED MEMORY DESIGN

(71) Applicant: DELL PRODUCTS L.P., Round Rock, TX (US)

(72) Inventors: Chunge-Wei Wang, Taipei (TW); Chihchung Lin, New Taipei (TW); Tse-An- Chu, Taipei (TW); Shih-Wei Yang, Taoyuan (TW); Yi Ling Tsai, New Taipei (TW)

(73) Assignee: DELL PRODUCTS L.P., Round Rock, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/731,967

(22) Filed: Apr. 28, 2022

(65) Prior Publication Data

US 2022/0253123 A1 Aug. 11, 2022

Related U.S. Application Data

(63) Continuation of application No. 16/883,554, filed on May 26, 2020, now Pat. No. 11,320,885.

(51) Int. Cl.
| | | |
|---|---|---|
| G06F 1/32 | (2019.01) | |
| G06F 1/3225 | (2019.01) | |
| G06F 9/4401 | (2018.01) | |
| G06F 1/3228 | (2019.01) | |
| G06F 1/3203 | (2019.01) | |
| G06F 1/3215 | (2019.01) | |

(52) U.S. Cl.
CPC .......... *G06F 1/3225* (2013.01); *G06F 1/3228* (2013.01); *G06F 9/4411* (2013.01); *G06F 1/3203* (2013.01); *G06F 1/3215* (2013.01)

(58) Field of Classification Search
CPC ..... G06F 1/3225; G06F 1/3228; G06F 9/4411
USPC ........................................ 713/323
See application file for complete search history.

(56) References Cited

U.S. PATENT DOCUMENTS

| | | | |
|---|---|---|---|
| 5,862,351 A * | 1/1999 | He ........................ | G06F 9/4403 710/104 |
| 6,681,336 B1 * | 1/2004 | Nakazato ................ | G06F 1/329 713/1 |
| 7,761,687 B2 | 7/2010 | Blumrich et al. | |
| 7,796,885 B2 | 9/2010 | Dress et al. | |
| 7,917,727 B2 | 3/2011 | Rhoades et al. | |
| 8,112,625 B2 | 2/2012 | Ginter et al. | |
| 8,193,466 B2 | 6/2012 | Bhutani et al. | |
| 8,625,625 B2 | 1/2014 | Anderson et al. | |
| 8,635,358 B2 | 1/2014 | Anderson et al. | |
| RE45,097 E | 8/2014 | Iyer et al. | |
| 8,987,624 B2 | 3/2015 | Bhutan et al. | |
| 9,628,365 B2 | 4/2017 | Gelvin et al. | |

(Continued)

*Primary Examiner* — Volvick Derose
(74) *Attorney, Agent, or Firm* — Jackson Walker LLP; Christopher J. Rourk

(57) ABSTRACT

A system for controlling an information handling system is disclosed that includes a central processing unit, a memory device, a power supply and a memory speed controller configured to determine one or more system parameters of the central processing unit, the memory device and the power supply, to store a boot setting as a function of the one or more system parameters and to cause a system reboot after storing the boot setting.

18 Claims, 2 Drawing Sheets

(56) References Cited

U.S. PATENT DOCUMENTS

| | | | |
|---|---|---|---|
| 10,379,007 B2 | 8/2019 | Perrone et al. | |
| 2003/0065915 A1* | 4/2003 | Yu | G06F 11/1417 713/1 |
| 2004/0025069 A1* | 2/2004 | Gary | G06F 1/3296 713/300 |
| 2005/0093524 A1* | 5/2005 | Hsu | G06F 1/3253 323/234 |
| 2005/0240745 A1* | 10/2005 | Iyer | G06F 13/1668 711/E12.079 |
| 2007/0234075 A1* | 10/2007 | Zimmer | G06F 1/32 713/300 |
| 2009/0210565 A1* | 8/2009 | Kohiga | G06F 9/4411 710/10 |
| 2009/0265575 A1* | 10/2009 | Chen | G06F 11/2289 713/600 |
| 2009/0300343 A1* | 12/2009 | Lan | G06F 9/44505 713/2 |
| 2010/0115300 A1* | 5/2010 | Wu | G06F 1/08 713/300 |
| 2010/0146252 A1* | 6/2010 | Chang | G06F 1/24 713/1 |
| 2010/0199119 A1* | 8/2010 | Sun | G06F 1/08 713/600 |
| 2010/0281278 A1* | 11/2010 | Hsiao | G06F 1/08 713/300 |
| 2011/0161706 A1* | 6/2011 | Huang | G06F 1/3203 713/323 |
| 2014/0136823 A1* | 5/2014 | Ragland | G06F 9/44505 713/1 |
| 2015/0249096 A1 | 9/2015 | Lupino et al. | |
| 2017/0115915 A1* | 4/2017 | Byun | G11C 29/08 |
| 2018/0188769 A1* | 7/2018 | Chen | G06F 11/24 |
| 2019/0171270 A1* | 6/2019 | Wells | G06F 1/324 |
| 2019/0187766 A1* | 6/2019 | Hirosawa | G06F 1/3206 |
| 2020/0192420 A1* | 6/2020 | Irshad | G09G 5/39 |

* cited by examiner

WIDE RANGE POWER MECHANISM FOR OVER-SPEED MEMORY DESIGN

CROSS-REFERENCE TO RELATED APPLICATIONS

The present application is a continuation of U.S. patent application Ser. No. 16/883,554 filed May 26, 2020, which is hereby incorporated by reference for all purposes as if set forth herein in its entirety.

TECHNICAL FIELD

The present disclosure relates generally to information handling systems, and more specifically to an information handling system with a wide range power mechanism for over-speed memory design.

BACKGROUND OF THE INVENTION

Information handling systems typically have a specific design that is configured based on specific system components, which requires additional engineering design work and which limits configuration flexibility.

SUMMARY OF THE INVENTION

A system for controlling an information handling system is disclosed that includes a central processing unit, a memory device, a power supply and a memory speed controller configured to determine one or more system parameters of the central processing unit, the memory device and the power supply, to store a boot setting as a function of the one or more system parameters and to cause a system reboot after storing the boot setting.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE SEVERAL VIEWS OF THE DRAWINGS

Aspects of the disclosure can be better understood with reference to the following drawings. The components in the drawings may be to scale, but emphasis is placed upon clearly illustrating the principles of the present disclosure. Moreover, in the drawings, like reference numerals designate corresponding parts throughout the several views, and in which.

DETAILED DESCRIPTION OF THE INVENTION

Figure 1:
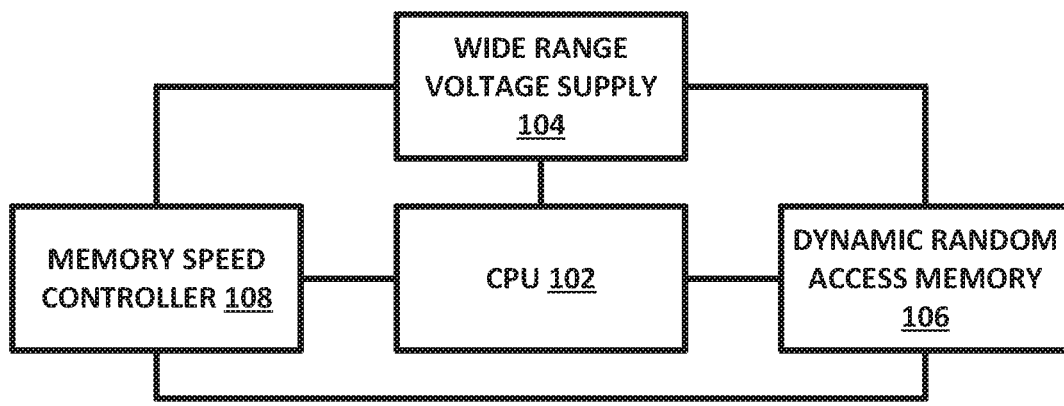
FIG. 1 is a diagram of an information handling system with a wide range power mechanism for over-speed memory design, in accordance with an example embodiment of the present disclosure.

In the description that follows, like parts are marked throughout the specification and drawings with the same reference numerals. The drawing figures may be to scale and certain components can be shown in generalized or schematic form and identified by commercial designations in the interest of clarity and conciseness.

To support higher performance data processing system solutions, it is possible to increase the clock speed of the dynamic random access memory (DRAM). However, in known systems, this is not considered to be a different type of memory design, which causes the performance and power requirements to not be optimized. The present disclosure provides a system and method for determining and controlling the memory voltage setting, to result in a lower power dissipation for a system with a light load and wide range power support for different types of memory.

The present disclosure links the basic input-output system (BIOS) and the power control, to dynamically change memory voltage and speed as a function of a central processing unit (CPU) identifier and the specific system power design. An additional over-voltage mode can also be provided for CPU and DRAM configurations that is capable of supporting the Intel Extreme Memory Profile (XMP) configuration.

The present disclosure provides a number of important technical advantages. One important technical advantage is the ability for the system performance to be based on the system requirements, to allow the system to dynamically change memory voltage and speed. Another important technical advantage is the ability to automatically switch the memory voltage and speed as a function of the CPU identifier and maximum memory module support capability. In contrast, the prior art does not provide the extra power architecture to support the wide range power demand required for dynamic memory configuration control. The present disclosure can increase memory performance by up to 12.5%, can enhance system performance and eliminate unstable voltage eon chip feedback. The present disclosure can also link the system BIOS and power design, to dynamically change memory voltage and speed as a function of CPU identifier and the specific power design of the system.

The present disclosure also provides for an additional over-voltage mode that can support the XMP configuration. In this wide range mode, the system BIOS can check the host capability using the Intel "K" stock keeping unit ("K-SKU") from the CPU identifier and STRP pin to dynamically change the memory power design. A system non-K SKU can follow the original setting. A system K-SKU can result in checking the memory speed for a non-XMP design, and using a normal XMP speed under 3200 Mhz by original setting, and an XMP speed over 3600 Mhz using the wide range setting.

FIG. 1 is a diagram of an information handling system 100 with a wide range power mechanism for over-speed memory design, in accordance with an example embodiment of the present disclosure. Information handling system 100 includes CPU 102, wide range voltage supply 104, dynamic random access memory 106 and memory speed controller 108, each of which can be implemented in hardware or a suitable combination of hardware and software.

CPU 102 can be an Intel CPU or other suitable processors that are capable of overclocking a memory device. In one example embodiment, CPU 102 can include an identifier, such as a K-SKU or other suitable identifiers, which can be used to determine the functional capabilities of CPU 102. CPU 102 can also or alternatively include one or more pins that are used to form an electrical connection between external system components and the CPU, such as an STRP pin that can be used to determine CPU 102 functional capabilities.

Wide range voltage supply 104 can be implemented as a stand-alone integrated circuit or in other suitable manners and can provide two or more different voltage levels for devices that it is coupled to, such as CPU 102 and dynamic random access memory 106. In one example embodiment, wide range voltage supply 104 can receive control data from memory speed controller 108 and can adjust the voltage that is output to one or more devices.

Dynamic random access memory 106 can be a memory device with one or more speed setting functions. In one example embodiment, dynamic random access memory 106 can support a plurality of different voltage settings, such as 1.2 V and 1.35 V, and a plurality of different speed settings, such as 2133 Mhz, 2667 Mhz, 2933 Mhz, 3200 Mhz, 3600 Mhz and 4200 Mhz, or other suitable settings.

Memory speed controller 108 can be implemented in hardware, such as in an application-specific integrated circuit, a field-programmable gate array or other suitable devices, as one or more algorithms loaded onto and operating on a programmable data processor or in other suitable manners. In one example embodiment, memory speed controller 108 can implement one or more algorithms that cause memory speed controller 108 to read data, such as from an STRP pin of a processor, from a data register of a processor or memory device, state data that identifies whether a boot process is in an RTC boot or a cold boot, or other suitable state and/or configuration data, and to generate one or more controls as a function of the state and/or configuration data. For example, memory speed controller 108 can cause a voltage of wide range voltage supply 104 to be 1.2 V or 1.35 V as a function of the state and/or configuration data, can cause a speed of dynamic random access memory 106 to be 2133 Mhz, 2667 Mhz, 2933 Mhz, 3200 Mhz, 3600 Mhz and 4200 Mhz, or can implement other suitable settings. An RTC boot is typically an initial state, when an "RTC battery" is attached for the first time, and where all settings will typically revert back to a default value. There is no specific setting in initial state, and this condition is typically encountered in first boot. For a cold boot, the end-user will typically turn off the system to an "S5—power off state with RTC battery," and the system will follow a cold boot flow when the power button is pressed afterwards.

In operation, information handling system 100 provides voltage and speed control settings for CPU 102, wide range voltage supply 104 and dynamic random access memory 106, using memory speed controller 108 to detect system state and system hardware components and to set the voltage and speed in response.

Figure 2:
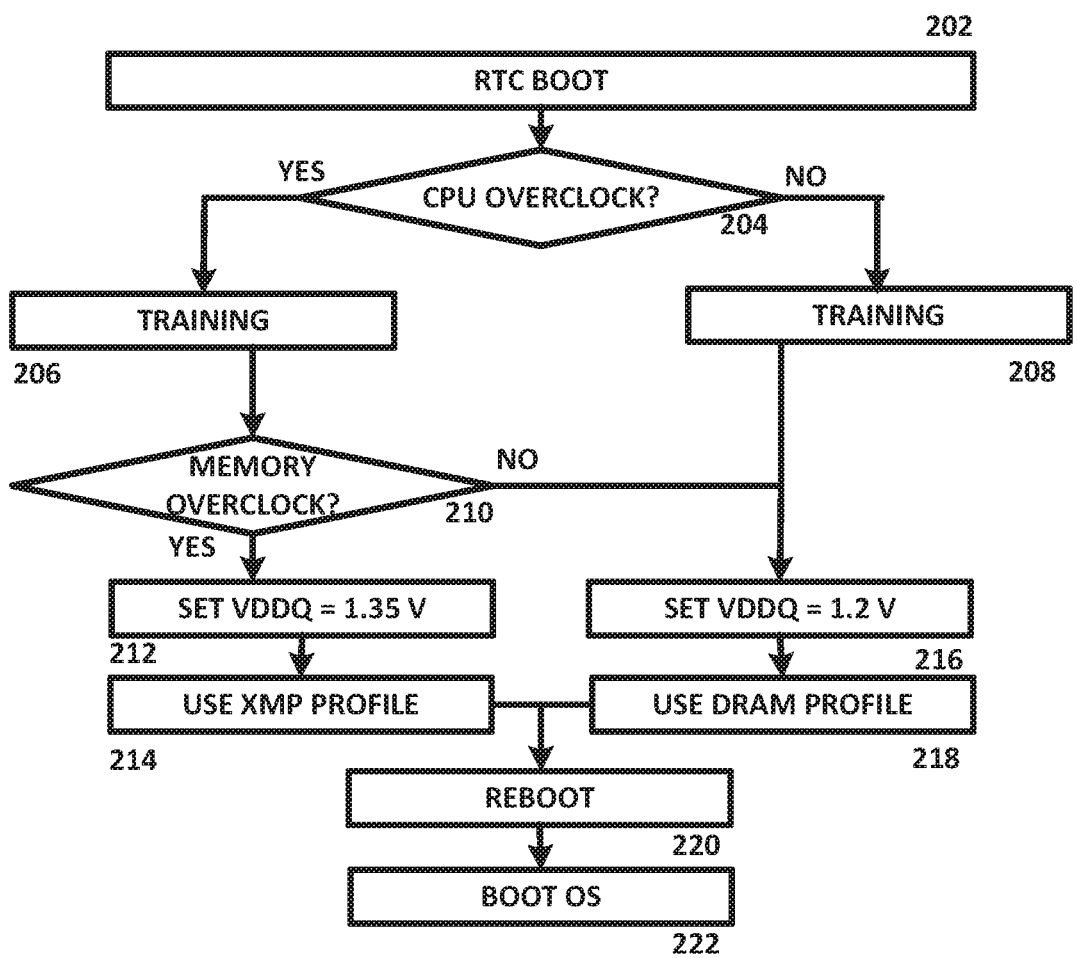
FIG. 2 is a flow chart of an algorithm for controlling an information handling system with a wide range power mechanism for over-speed memory design from a real time clock boot, in accordance with an example embodiment of the present disclosure.

FIG. 2 is a flow chart of an algorithm 200 for controlling an information handling system with a wide range power mechanism for over-speed memory design from a real time clock (RTC) boot, in accordance with an example embodiment of the present disclosure. Algorithm 200 can be implemented in hardware or a suitable combination of hardware and software.

Algorithm 200 begins at 202, where an RTC boot occurs. The algorithm then proceeds to 204.

At 204, it is determined whether the CPU is capable of an overclock configuration. If it is determined that the CPU is capable of an overclock configuration, a boot setting is implemented for an overclock configuration setting, and the algorithm the proceeds to 206. Otherwise, a boot setting is implemented for a standard configuration setting, and the algorithm proceeds to 208.

At 206, a training procedure is implemented. In one example embodiment, the training procedure can be implemented by rebooting to an overclock configuration setting, or other suitable processes can also or alternatively be used. The algorithm then proceeds to 210.

At 208, a training procedure is implemented. In one example embodiment, the training procedure can be implemented by rebooting to a standard configuration setting, or other suitable processes can also or alternatively be used. The algorithm then proceeds to 210.

At 210, it is determined whether a memory can support one or more overclock settings. In one example embodiment, the memory can have a selectable speed setting, where a voltage required for an overclock speed can be higher than a standard voltage setting. If it is determined that the memory can support one or more of the overclock settings, the algorithm proceeds to 212, otherwise the algorithm then proceeds to 216.

At 212, the voltage of a voltage supply is set to a predetermined setting, such as 1.35 Volts or other suitable settlings. In one example embodiment, the voltage supply can be a wide range voltage supply with a selectable voltage, different dedicated voltage supplies can be used, or other suitable embodiments can also or alternatively be used. The algorithm then proceeds to 214.

At 214, an XMP profile setting is selected. In one example embodiment, the XMP profile setting can be stored in a predetermined data memory register associated with a boot process, or in other suitable manners. The algorithm then proceeds to 220.

At 216, the voltage of a voltage supply is set to a predetermined setting, such as 1.2 Volts or other suitable settlings. In one example embodiment, the voltage supply can be a voltage supply with a dedicated voltage, or other suitable embodiments can also or alternatively be used. The algorithm then proceeds to 218.

At 218, a DRAM profile setting is selected. In one example embodiment, the DRAM profile setting can be stored in a predetermined data memory register associated with a boot process, or in other suitable manners. The algorithm then proceeds to 220.

At 220, the system reboots. The algorithm then proceeds to 222. At 222, the operating system boots.

In operation, algorithm 200 controls an information handling system with a wide range power mechanism for over-speed memory design from an RTC boot. Although algorithm 200 is shown as a flow chart, a person of skill in the art will recognize that it can also or alternatively be implemented using object-oriented programming, a state diagram, a ladder diagram or in other suitable manners.

Figure 3:
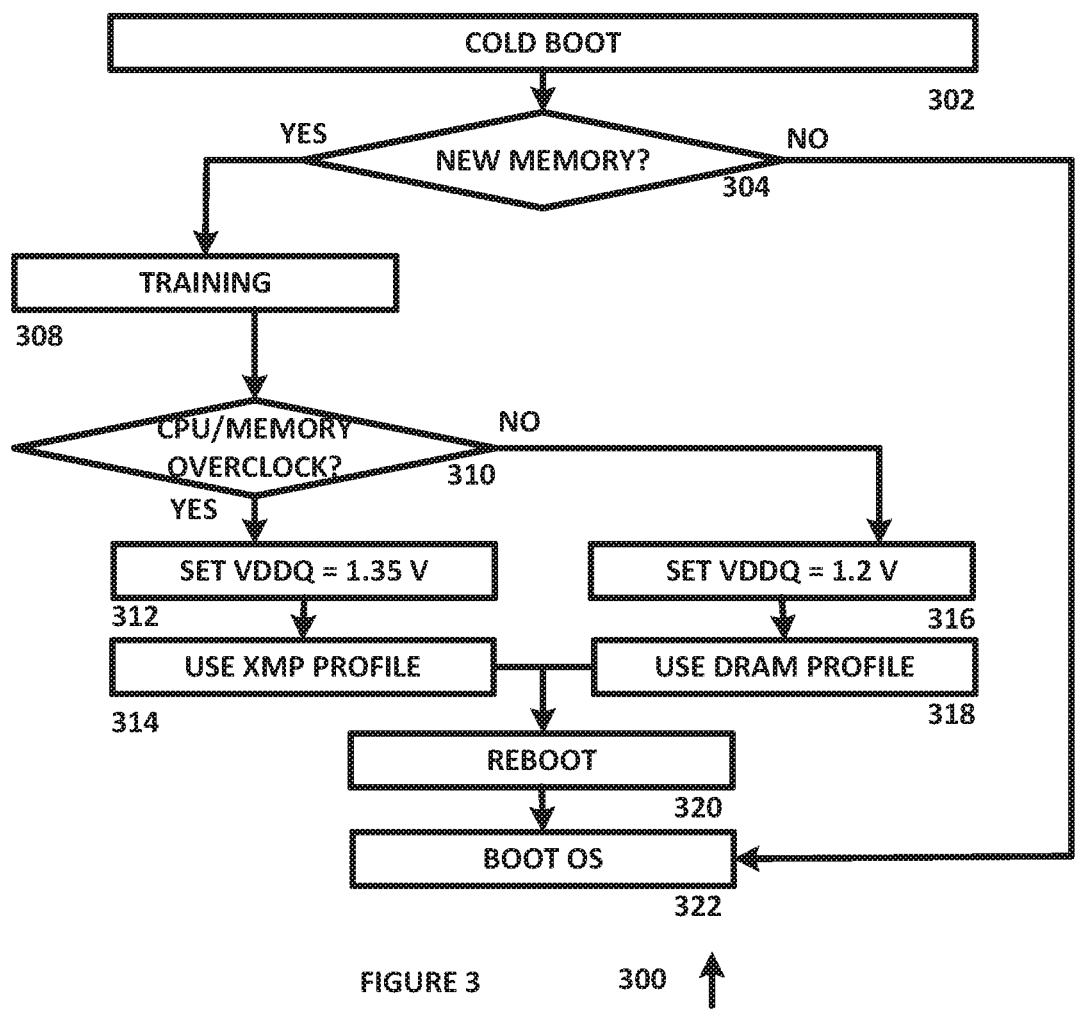
FIG. 3 is a flow chart of an algorithm 300 for controlling an information handling system with a wide range power mechanism for over-speed memory design from a cold boot, in accordance with an example embodiment of the present disclosure.

FIG. 3 is a flow chart of an algorithm 300 for controlling an information handling system with a wide range power mechanism for over-speed memory design from a cold boot, in accordance with an example embodiment of the present disclosure. Algorithm 200 can be implemented in hardware or a suitable combination of hardware and software.

Algorithm 300 begins at 302, where a cold boot occurs. The algorithm then proceeds to 304.

At 304, it is determined whether a new memory device has been installed or is present. If it is determined that a new memory has been installed, the algorithm the proceeds to 308. Otherwise, the algorithm proceeds to 332.

At 308, a training procedure is implemented. In one example embodiment, the training procedure can be implemented by rebooting to a stored configuration setting, or other suitable processes can also or alternatively be used. The algorithm then proceeds to 310.

At 310, it is determined whether a CPU and memory can support one or more overclock settings. In one example embodiment, the memory can have a selectable speed setting, where a voltage required for an overclock speed can be higher than a standard voltage setting. If it is determined that the CPU and memory can support one or more of the overclock settings, the algorithm proceeds to 312, otherwise the algorithm then proceeds to 316.

At 312, the voltage of a voltage supply is set to a predetermined setting, such as 1.35 Volts or other suitable settlings. In one example embodiment, the voltage supply can be a wide range voltage supply with a selectable voltage, different dedicated voltage supplies can be used, or other suitable embodiments can also or alternatively be used. The algorithm then proceeds to 314.

At 314, an XMP profile setting is selected. In one example embodiment, the XMP profile setting can be stored in a predetermined data memory register associated with a boot process, or in other suitable manners. The algorithm then proceeds to 320.

At 316, the voltage of a voltage supply is set to a predetermined setting, such as 1.2 Volts or other suitable settlings. In one example embodiment, the voltage supply can be a voltage supply with a dedicated voltage, or other suitable embodiments can also or alternatively be used. The algorithm then proceeds to 318.

At 318, a DRAM profile setting is selected. In one example embodiment, the DRAM profile setting can be stored in a predetermined data memory register associated with a boot process, or in other suitable manners. The algorithm then proceeds to 320.

At 320, the system reboots. The algorithm then proceeds to 322. At 322, the operating system boots.

In operation, algorithm 300 controls an information handling system with a wide range power mechanism for over-speed memory design from a cold boot. Although algorithm 300 is shown as a flow chart, a person of skill in the art will recognize that it can also or alternatively be implemented using object-oriented programming, a state diagram, a ladder diagram or in other suitable manners.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

As used herein, "hardware" can include a combination of discrete components, an integrated circuit, an application-specific integrated circuit, a field programmable gate array, or other suitable hardware. As used herein, "software" can include one or more objects, agents, threads, lines of code, subroutines, separate software applications, two or more lines of code or other suitable software structures operating in two or more software applications, on one or more processors (where a processor includes one or more microcomputers or other suitable data processing units, memory devices, input-output devices, displays, data input devices such as a keyboard or a mouse, peripherals such as printers and speakers, associated drivers, control cards, power sources, network devices, docking station devices, or other suitable devices operating under control of software systems in conjunction with the processor or other devices), or other suitable software structures. In one exemplary embodiment, software can include one or more lines of code or other suitable software structures operating in a general purpose software application, such as an operating system, and one or more lines of code or other suitable software structures operating in a specific purpose software application. As used herein, the term "couple" and its cognate terms, such as "couples" and "coupled," can include a physical connection (such as a copper conductor), a virtual connection (such as through randomly assigned memory locations of a data memory device), a logical connection (such as through logical gates of a semiconducting device), other suitable connections, or a suitable combination of such connections. The term "data" can refer to a suitable structure for using, conveying or storing data, such as a data field, a data buffer, a data message having the data value and sender/receiver address data, a control message having the data value and one or more operators that cause the receiving system or component to perform a function using the data, or other suitable hardware or software components for the electronic processing of data.

In general, a software system is a system that operates on a processor to perform predetermined functions in response to predetermined data fields. A software system is typically created as an algorithmic source code by a human programmer, and the source code algorithm is then compiled into a machine language algorithm with the source code algorithm functions, and linked to the specific input/output devices, dynamic link libraries and other specific hardware and software components of a processor, which converts the processor from a general purpose processor into a specific purpose processor. This well-known process for implementing an algorithm using a processor should require no explanation for one of even rudimentary skill in the art. For example, a system can be defined by the function it performs and the data fields that it performs the function on. As used herein, a NAME system, where NAME is typically the name of the general function that is performed by the system, refers to a software system that is configured to operate on a processor and to perform the disclosed function on the disclosed data fields. A system can receive one or more data inputs, such as data fields, user-entered data, control data in response to a user prompt or other suitable data, and can determine an action to take based on an algorithm, such as to proceed to a next algorithmic step if data is received, to repeat a prompt if data is not received, to perform a mathematical operation on two data fields, to sort or display data fields or to perform other suitable well-known algorithmic functions. Unless a specific algorithm is disclosed, then any suitable algorithm that would be known to one of skill in the art for performing the function using the associated data fields is contemplated as falling within the scope of the disclosure. For example, a message system that generates a message that includes a sender address field, a recipient address field and a message field would encompass software operating on a processor that can obtain the sender address field, recipient address field and message field from a suitable system or device of the processor, such as a buffer device or buffer system, can assemble the sender address field, recipient address field and message field into a suitable electronic message format (such as an electronic mail message, a TCP/IP message or any other suitable message format that has a sender address field, a recipient address field and message field), and can transmit the electronic message using electronic messaging systems and devices of the processor over a communications medium, such as a network. One of ordinary skill in the art would be able to provide the specific coding for a specific application based on the foregoing disclosure, which is intended to set forth exemplary embodiments of the present disclosure, and not to provide a tutorial for someone having less than ordinary skill in the art, such as someone who is unfamiliar with programming or processors in a suitable programming language. A specific algorithm for performing a function can be provided in a flow chart form or in other suitable formats, where the data fields and associated functions can be set forth in an exemplary order of operations, where the order can be rearranged as suitable and is not intended to be limiting unless explicitly stated to be limiting.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed is:

1. A system for controlling an information handling system, comprising:
   a central processing unit (CPU);
   a memory device;
   a power supply; and
   a memory speed controller directly coupled to the power supply and configured to determine system parameters of the CPU, the memory device and the power supply including a voltage as a function of a frequency, the memory speed controller further configured to store a boot setting as a function of the system parameters, the memory speed controller further configured to cause a system reboot after storing the boot setting, wherein the storing of the boot setting is performed during a training function.

2. The system of claim 1 wherein the memory device is a dynamic random access memory (DRAM) device and the system parameter is a speed of the DRAM device.

3. The system of claim 1 wherein at least one of the system parameters is a speed of the CPU.

4. The system of claim 1 wherein the power supply is a wide range power supply and at least one of the system parameters is a voltage setting of the wide range power supply.

5. The system of claim 4 wherein the voltage setting is 1.35 V for VDDQ.

6. The system of claim 4 wherein the voltage setting is 1.2 V for VDDQ.

7. The system of claim 6 wherein at least one of the system parameters further comprises a dynamic random access memory device profile.

8. The system of claim 1 wherein at least one of the system parameters further comprises a memory device profile.

9. The system of claim 8 wherein at least one of the system parameters further comprises an Intel Extreme Memory Profile memory device profile.

10. A method for controlling an information handling system, comprising:
    determining one or more system parameters using an algorithm operating on a CPU;
    determining one or more parameters of a memory device using the algorithm operating on the CPU;
    storing a boot setting as a function of the one or more system parameters using a memory speed controller that is directly coupled to a power supply wherein the storing of the boot setting is performed during a training function; and
    causing a system reboot after storing the boot setting using the memory speed controller.

11. The method of claim 10 wherein the memory device is a dynamic random access memory (DRAM) device and the system parameter is a speed of the DRAM device.

12. The method of claim 10 wherein the CPU parameter is a speed of the CPU.

13. The method of claim 10 wherein the power supply is a wide range power supply and the system parameters include a voltage setting of the wide range power supply.

14. The method of claim 13 wherein the voltage setting is 1.35 V for VDDQ.

15. The method of claim 13 wherein the voltage setting is 1.2 V for VDDQ.

16. The method of claim 15 wherein one of the system parameters further comprises a dynamic random access memory device profile.

17. The method of claim 10 wherein one of the system parameters further comprises a memory device profile.

18. The method of claim 17 wherein one of the system parameters further comprises an Intel Extreme Memory Profile memory device profile.

* * * * *